United States Patent
Yang et al.

(10) Patent No.: US 8,266,495 B2
(45) Date of Patent: Sep. 11, 2012

(54) SYSTEMS AND METHODS FOR PERFORMING CONCATENATED ERROR CORRECTION

(75) Inventors: Xueshi Yang, Cupertino, CA (US); Zining Wu, Los Altos, CA (US); Seo-How Low, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 848 days.

(21) Appl. No.: 12/361,327

(22) Filed: Jan. 28, 2009

(65) Prior Publication Data

US 2009/0210771 A1 Aug. 20, 2009

Related U.S. Application Data

(60) Provisional application No. 61/030,070, filed on Feb. 20, 2008.

(51) Int. Cl.
*H03M 13/00* (2006.01)
(52) U.S. Cl. .................................................. 714/755
(58) Field of Classification Search ................ 714/755
See application file for complete search history.

(56) References Cited

U.S. PATENT DOCUMENTS

| | | | |
|---|---|---|---|
| 5,392,299 A * | 2/1995 | Rhines et al. | 714/756 |
| 6,104,765 A | 8/2000 | Fredrickson | |
| 6,507,546 B1 | 1/2003 | Bliss et al. | |
| 6,546,515 B1 | 4/2003 | Vary et al. | |
| 7,050,511 B2 | 5/2006 | Jeong et al. | |
| 2002/0056064 A1 * | 5/2002 | Kidorf et al. | 714/755 |
| 2005/0111564 A1 | 5/2005 | Kramer et al. | |
| 2005/0180369 A1 | 8/2005 | Hansen et al. | |
| 2005/0268205 A1 | 12/2005 | Rhee et al. | |
| 2006/0031737 A1 * | 2/2006 | Chugg et al. | 714/755 |
| 2007/0089034 A1 * | 4/2007 | Litsyn et al. | 714/763 |
| 2008/0109703 A1 * | 5/2008 | Brandman | 714/763 |
| 2010/0131820 A1 * | 5/2010 | Song et al. | 714/755 |

* cited by examiner

*Primary Examiner* — M. Mujtaba K Chaudry
*Assistant Examiner* — Enam Ahmed

(57) ABSTRACT

A system and method is provided for performing concatenated error correction. In one implementation, an apparatus for encoding data includes an outer encoder to generate a code word corresponding to received input data and a parity circuit to compute parities of logical cells of data, the logical cells of data being obtained from the code word and having a first logical cell. The apparatus also includes an inner encoder to generate an error correction bit for the first logical cell based on a first parity corresponding to the first logical cell, and to insert the error correction bit in the first logical cell.

11 Claims, 6 Drawing Sheets

SYSTEMS AND METHODS FOR PERFORMING CONCATENATED ERROR CORRECTION

RELATED APPLICATIONS

This application claims the benefit of priority to U.S. Provisional Application No. 61/030,070, filed on Feb. 20, 2008, titled "Asymmetric Error Correction Codes for Flash Memory," the contents of which are hereby incorporated by reference in their entirety.

BACKGROUND

1. Technical Field

The systems and methods disclosed herein relate to the field of performing error correction and, more specifically, to systems and methods of performing concatenated error correction on data stored in non-volatile memory.

2. Description of the Related Art

Non-volatile memory, such as flash EEPROM memory and/or NAND flash memory, is used in a variety of electronic devices. For example, non-volatile memory may be used in a cellular phone, a personal digital assistant, a radio, a personal computer, a notebook, a workstation, a camera, an audio player, a global positioning device, a server, and other devices. Non-volatile memory may include a number of cells at different levels, where the cells may be programmed to store information as a series of binary digits (0 and 1) or "bits."

As with most electronic devices, non-volatile memory devices are susceptible to defects and errors. Errors may result from factors including the shifting of threshold levels of the memory states as a result of normal operations of the memory device including write/program, erase, and/or read operations. For example, during a program operation electrons may be added to charge the cell to reflect a particular state.

During programming of a memory cell, it is more difficult to transfer multiple discrete units of charge (electrons) to the memory cell than it is to simply fully charge or discharge the memory cell. Moreover, once the programming operation begins and electrons are being added, it is difficult to remove charge without performing an erase function. This approach may cause a cell to be programmed incorrectly and may cause "overshoot" errors—i.e., the cells that are adjacent to the cell being programmed may receive extra electrons that should have been added to the cell being charged. Since, electrons may not be removed easily, the errors caused due to overshoot may be referred to as an "asymmetric error" or a "one-directional error," and error correction code (ECC) techniques may be used to correct these errors.

In conventional systems, ECC techniques involve generating redundant bits (parity bits) that are added to the end of data strings during program operations. These redundant bits may then be utilized to detect and correct errors as data is read out from the non-volatile memory. However, conventional techniques involve the use of asymmetric error code, where code words consisting of asymmetric error correction code may be included in the end of data strings. The asymmetric error correction code used in conventional systems usually only corrects one directional error types. In real systems, errors are not strictly one directional, rendering such codes of little practical value.

SUMMARY

In one embodiment consistent with the presently-claimed invention, an apparatus for encoding data is provided. The apparatus comprises an outer encoder to generate a code word corresponding to received input data, a parity circuit to compute parities of logical cells of data, the logical cells of data being obtained from the code word and having a first logical cell, and an inner encoder to generate an error correction bit for the first logical cell based on a first parity corresponding to the first logical cell, and to insert the error correction bit In the first logical cell.

Consistent with another embodiment of the presently-claimed invention, there is provided a method for encoding data by using an encoder, the method comprising generating a code word corresponding to received input data, dividing the code word into logical cells of data having a first logical cell, computing a first parity of the first logical cell, generating an error correction bit for the first logical cell based on the first parity, inserting the error correction bit in the first logical cell, and multiplexing and outputting the logical cells of data with the error correction bit.

In another embodiment consistent with the presently-claimed invention, a method for performing concatenated error correction, is provided. The method comprises computing parities corresponding to logical cells of data, decoding the parities, detecting error in the parities, performing asymmetric error correction to correct a data bit in one of the logical cells of data based on the detected error, and performing error correction on the logical cells of data when the detected error is corrected.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate various embodiments. In the drawings.

DESCRIPTION OF THE EMBODIMENTS

In the following description, for purposes of explanation and not limitation, specific techniques and embodiments are set forth, such as particular sequences of steps, interfaces and configurations, in order to provide a thorough understanding of the techniques presented herein. While the techniques and embodiments will primarily be described in context with the accompanying drawings, those skilled in the art will further appreciate that the techniques and embodiments can also be practiced in other electronic devices or systems.

Reference will now be made in detail to exemplary embodiments of the presently-claimed invention, examples of which are illustrated in the accompanying drawings. Wherever possible, the same reference numbers will be used throughout the drawings to refer to the same or like parts.

Figure 1:
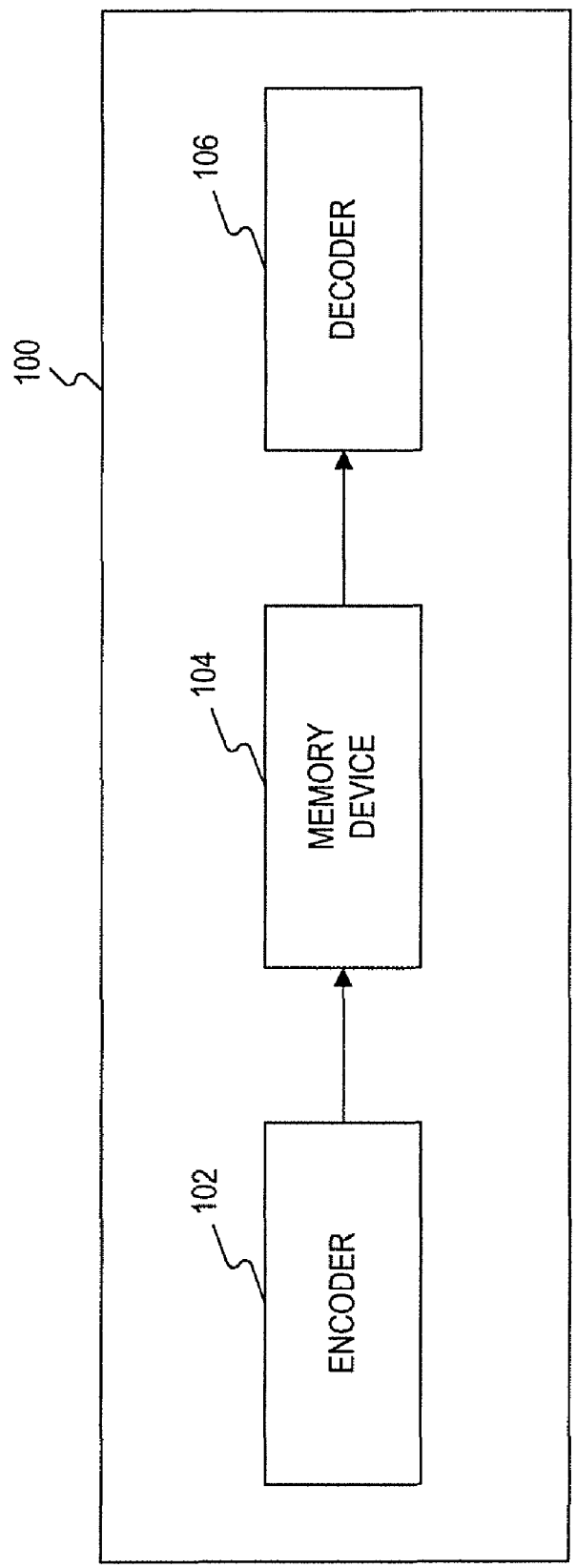
FIG. 1 is a block diagram illustrating a system for encoding and decoding data, consistent with one embodiment of the presently-claimed invention.

FIG. 1 illustrates a system 100 for encoding and decoding data, consistent with one embodiment of the presently-claimed invention. System 100 may be integrated as a unit in one electronic device or may be implemented over a plurality of different electronic devices performing coordinated processing tasks. For example, system 100 may be implemented in or across devices such as a cellular phone, a personal digital assistant, a radio, a personal computer, a notebook, a workstation, a camera, an audio player, a global positioning device, a server, nodes of a communication system, and other devices.

System 100 may include an encoder 102, a memory device 104, and/or a decoder 106. Encoder 102 may receive and/or retrieve data to be written into memory device 104. The data may be received and/or retrieved from a different component (not shown) in system 100 and/or a different system (not shown). As is described in further detail below, encoder 102 may use various encoding techniques to process and encode the data. For example, encoder 102 may include asymmetric error correction code and symmetric error correction code in the encoded data by including code such Hamming code, BCH code, Reed-Muller code, Array Code, Reed-Solomon (RS) code, low-density-parity check code (LDPC), turbo code, convolutional code, and/or other error correction codes that will be apparent to those of skill in the art.

The encoded data may then be written into memory cells of memory device 104. The encoded data may have a concatenated code structure including a layer of outer code and a layer of inner code, the inner code being asymmetric error correction code based on the parity of cell binary data, and the outer code being symmetric error correction code based on a symbol boundary that may coincide with the cell boundary of memory device 104.

Memory device 104 may be a multi-level solid state nonvolatile memory such as a flash memory, an EEPROM, or any other non-volatile memory apparent to those of skill in the art. Memory device 104 may include one or more memory cell arrays and read and write (program) circuitry. Subsequent to programming of memory device 104 with the encoded data, decoder 106 may read and/or retrieve the stored data. During read operation decoder 106 may implement a threshold-based approach, where data is read out by determining if a voltage value associated with a particular cell is less than or greater than one or more threshold values.

As is described in further detail below, decoder 106 may decode the data and use the error correction code included in the encoded data by encoder 102 to detect and correct errors. The decoding sequence may be in an opposite sequence from the encoding sequence, where asymmetric and/or inner error correction code may be decoded first and the symmetric and/or outer error correction code may be decoded second. The decoded and corrected data may then be used to perform various processing tasks in system 100.

Although not shown, system 100 may include a combination of one or more application program and/or hardware components. For example, an application program may include a software module, a sequence of instructions, a routine, a data structure, a display interface, and/or another type of structure that may be executed on a processor from a computer-readable storage medium to perform operations of the presently-claimed invention. Further, hardware components may include a combination of Central Processing Units (CPUs), buses, memory devices, storage units, data processors, control devices, analog-to-digital converters, digital-to-analog converters, modulators, transmitters, receivers, antennas, transceivers, input devices, output devices, network interface devices, and/or another type of component that is apparent to those skilled in the art.

Figure 2:
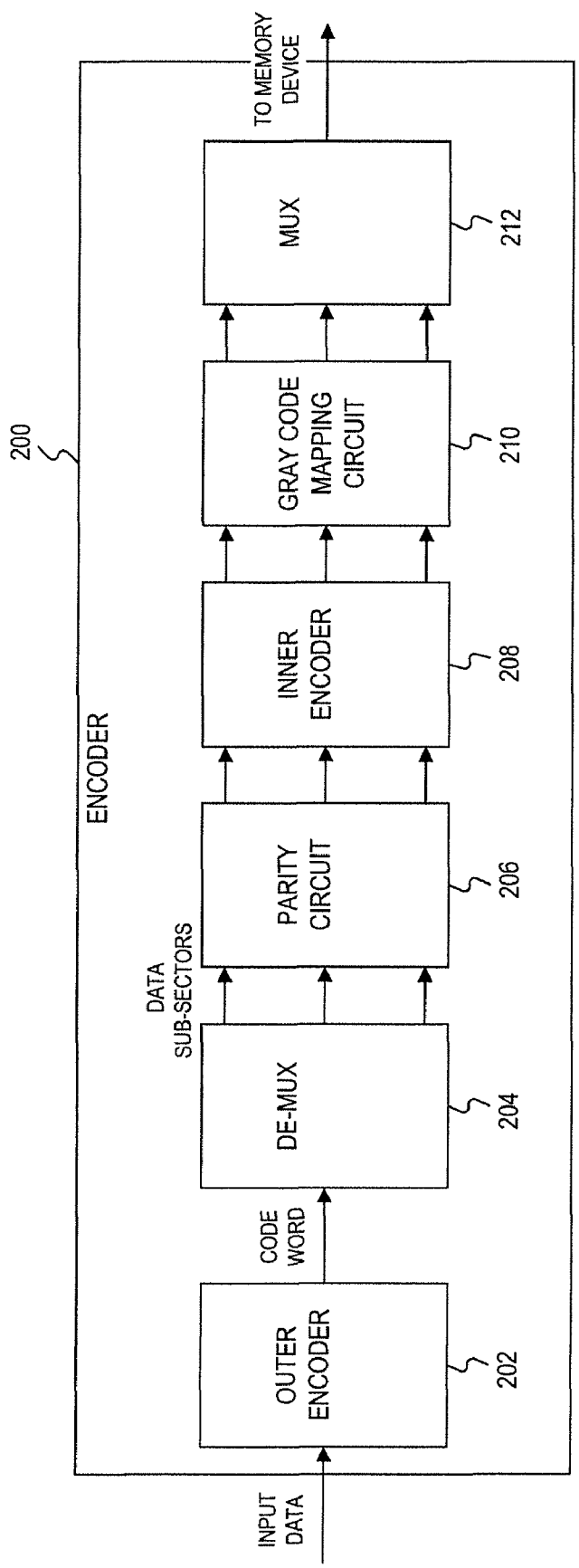
FIG. 2 is a block diagram illustrating an encoder, consistent with one embodiment of the presently-claimed invention.

Referring now to FIG. 2, an exemplary embodiment of an encoder 200 is illustrated. Encoder 200 may correspond to encoder 102 of system 100 and may perform encoding tasks consistent with one embodiment of the invention. Encoder 200 may include an outer encoder 202, a demultiplexer (De-MUX) 204, a parity circuit 206, an inner encoder 208, a gray code mapping circuit 210, and/or a multiplexer (MUX) 212. As will be apparent to those of skill in the art, encoder 200 may not require all of the components 202, 204, 206, 208, 210, and 212 to encode input data consistent with the invention and one or more processing tasks may be performed by a single component during encoding of the input data.

Encoder 200 may receive input data, which may need to be written and/or programmed into a memory device. The input data may be sent to outer encoder 202, which may be implemented by using a Reed-Solomon encoder. Outer encoder 202 may perform symmetric code encoding by generating a code word that may include a symbol boundary corresponding with a cell boundary of the memory device the data will be written into. Since encoder 200 implements a concatenated error correction code structure, outer encoder 202 may use a less resource-intensive technique and may include less robust error correction code while generating the code word.

The generated code word may then be inputted into De-MUX 204, where the code word may need to be divided into multiple sub-sectors of data. De-MUX 204 may divide the code word into sub-sectors of data based on the memory capacity of memory cells that the input data may be written into. For example, if a memory cell of the memory device has a capacity of storing four bits of data, De-MUX 204 may divide the code word into sub-sectors of four and/or three bits of data, where a sub-sectors may be divided into three bits of data to leave space for inner encoder 208 to insert an error correction code such as a BCH redundancy bits.

The sub-sectors of data bits may then be inputted into parity circuit 208, where the sub-sectors may be further divided into groups of logical cells of data and the parities of the groups of logical cells of data may be calculated. The generated parities may then be inputted to inner encoder 208, where inner encoder may be implemented by using a BCH encoder. Inner encoder 208 may generate additional error correction code such as BCH redundancy bits and may encode the parities and the BCH redundancy bits with the logical cells. The encoded data may then be inputted to the gray code mapping circuit 210, where the encoded data may be mapped to a signal level corresponding to memory cells of the memory device that the encoded data may be written into. The mapped signal may then be multiplexed by MUX 212 and then may be written and/or programmed into memory cells of the memory device.

Figure 3:
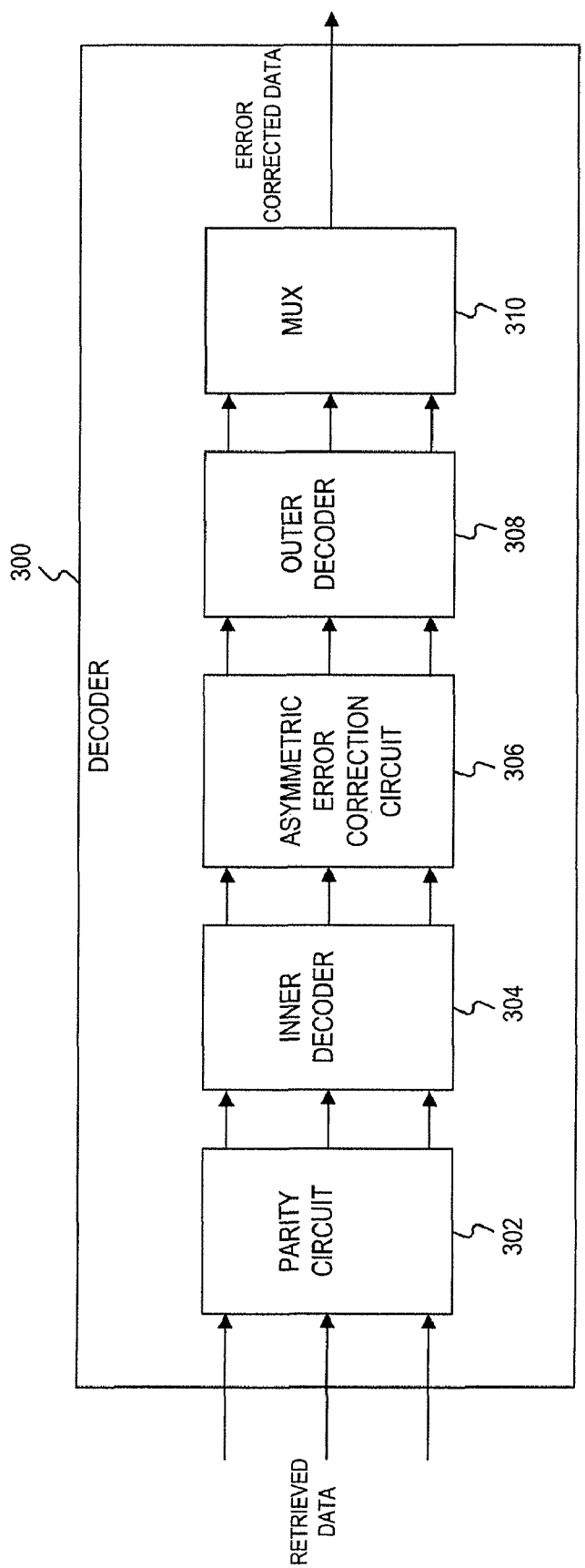
FIG. 3 is a block diagram illustrating a decoder, consistent with one embodiment of the presently-claimed invention.

FIG. 3 shows an exemplary embodiment of a decoder 300, consistent with one embodiment of the invention. Decoder 300 may correspond to decoder 106 and may perform decoding tasks in system 100. Decoder 300 may include a parity circuit 302, an inner decoder 304, an asymmetric error correction circuit 306, an outer decoder, and a multiplexer (MUX) 310. As will be apparent to those of skill in the art, decoder 300 may not require all of the components 302, 304, 306, 308, and 310 to decode retrieved data and one or more processing tasks may be performed by a single component during decoding of the input data.

Decoder 300 may read and/or retrieve data programmed in memory cells of a memory device. The retrieved data may be sent to parity circuit 302, where the retrieved data may be divided into groups of data and parities of the groups of data may be calculated. The groups of data and the parities may then be inputted into inner decoder 304, where the parities may be decoded and parity errors may be detected. Upon detection of parity errors, asymmetric error correction circuit 306 may correct the errors. During error correction, asymmetric error correction circuit 306 may make an assumption that the error is one-directional and the error is a minimum distance error, that is, the error in a logical cell resulted from a shift to an adjacent state that is in one side (e.g., left) of the original intended program state.

Once the error is corrected by the asymmetric error correction circuit 306, the corrected data may be inputted into outer decoder 308, where any residual errors may be corrected. Outer decoder 308 may correct errors that may not be one-directional and/or minimum distance error events. The corrected data may then be inputted into MUX 310, which may multiplex the corrected groups of data into a data stream and may output it for performing processing tasks.

Figure 4:
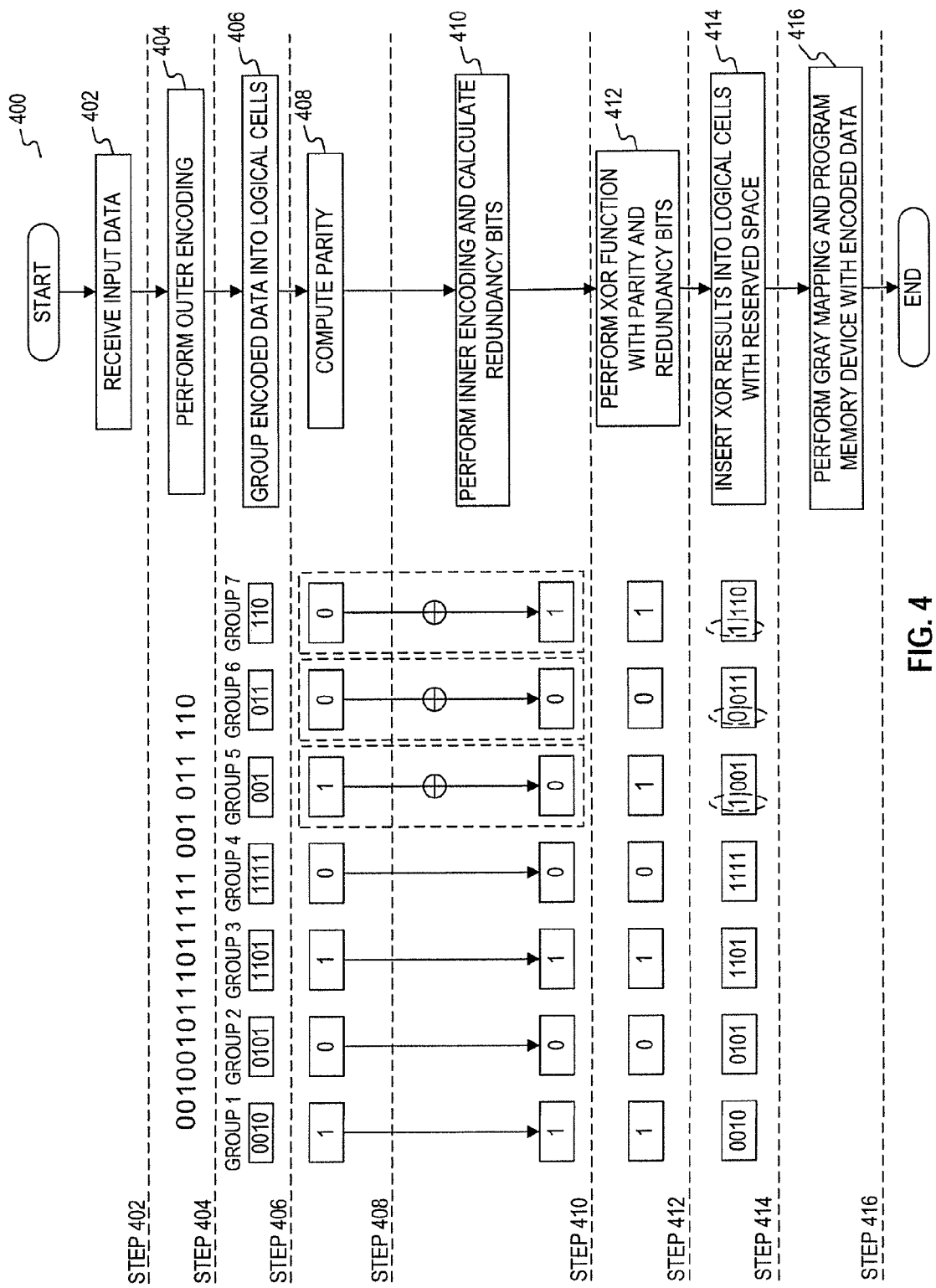
FIG. 4 is a flow diagram illustrating an encoding sequence, consistent with one embodiment of the presently-claimed invention.

Referring now to FIG. 4, a flow diagram of a method 400 for writing encoded data in a memory device, consistent with one embodiment the invention is provided. Method 400 may be implemented by using encoder 200. Steps 402-416 of method 400 are provided for illustration and not for limitation purposes. The method begins in step 402 where input data to be encoded and written into memory cells of a memory device may be received. Next, in step 404, outer encoding may be performed on the received input data and a code word may be generated. Step 404 may be performed by, for example, outer encoder 202 in encoder 200 and the generated code word may consist of a plurality of binary data bits such as 00100101110111111001011110.

Next, in step 406, the encoded data may be grouped into a plurality of logical cells based on memory capacities of memory cells in which the binary data bits may be written. Step 406 may be performed by, for example, De-MUX 204 in encoder 200 and the plurality of groups of binary data may include four or three bits of binary data if the memory capacity of the memory cells may only store four bits of data. As is shown in FIG. 4, the groups may include a first group including binary data bits 0010, a second group including binary data bits 0101, a third group including binary data bits 1101, a fourth group including binary data bits 1111, a fifth group including binary data bits 001, a sixth group including binary data bits 011, and a seventh group including binary data bits 110. Groups five, six, and seven may include only three bits to leave space for insertion of an additional bit that may be inserted for error correction purposes.

The method may then move to step 408, where parities of the groups of logical cells may be calculated. Step 408 may be performed by, for example, parity circuit 206 in encoder 200 and, as is shown in FIG. 4, the computed parities may be 1 for group one, 0 for group two, 1 for group three, 0 for group four, 1 for group five, 0 for group six, and 0 for group seven. Next, in step 410, inner encoding may be performed with the parity bits. For example, step 410 may be performed by inner encoder 208 in encoder 200, where three parities (0, 0, and 1) are generated based on the parities of the first four groups (1, 0, 1, 0).

Next, in step 412, an exclusive OR (XOR) function may be performed between the parities calculated in step 408 and the redundancy bits calculated in step 410 for the groups of data having three bits of data. The resulting bits from the XOR function may then be inserted into the logical cells having only three bits of data (step 414). Steps 412 and 414 may also be performed by, for example, inner encoder 208 in encoder 200, where bits 1, 0, and 1 may be inserted in groups five, six, and seven, respectively. Steps 412 and 414 may be referred to as "parity hiding." In step 416, the encoded groups of data may be gray-mapped based on corresponding memory cells of the memory device, so that the method may end after the groups of data may be written into the memory cells.

Figure 5:
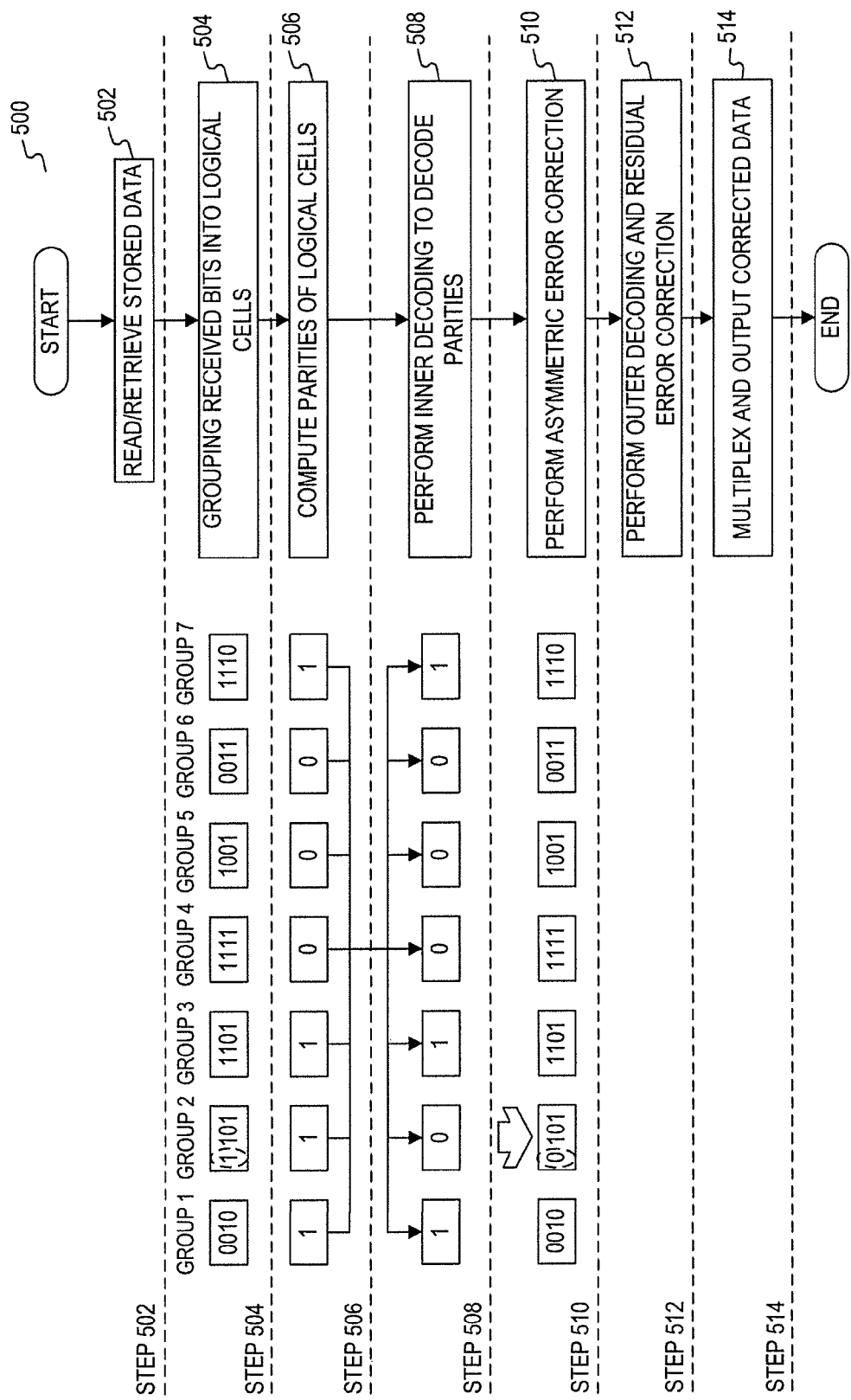
FIG. 5 is a flow diagram illustrating a decoding and concatenated error correction sequence, consistent with one embodiment of the presently-claimed invention.

FIG. 5 shows a flow diagram of a method 500 for performing concatenated error correction on data written into a memory device, consistent with one embodiment the invention. Method 500 may be implemented by using decoder 300. Steps 502-514 of method 500 are provided for illustration and not for limitation purposes. The method begins in step 502 where data stored in memory cells of a memory device may be read and/or retrieved. Next, in step 504 the retrieved data may be grouped into seven groups of logical cells of data, where the second group of data may have an error that may need to be corrected. For example, the first bit in the second group of logical cell may be 1, when the correct value should be 0.

Next, in step 506, parities corresponding to the groups of logical cells may be computed. Step 506 may be performed by, for example, parity circuit 302 in decoder 300 and the calculated parities may be 1 for group one, 1 for group two, 1 for group three, 0 for group four, 0 for group five, 0 for group six, and 1 for group seven. Next, in step 508, inner decoding may be performed to decode parities and error in the parities may be detected. Step 508 may be performed by, for example, inner decoder 304 in decoder 300 and BCH decoding may be performed to detect that the parity of 1 corresponding to the second group may be due to an error.

Next, asymmetric error correction may be performed based on parity errors (step 510). For example, step 510 may be performed by asymmetric error correction circuit where the error in the parity of the second group may be detected and the first bit in the second group may be corrected from 1 to 0. Although not shown in step 510, an assumption may be made that the parity error is a one-directional error and a minimum distance error event.

Figure 6:
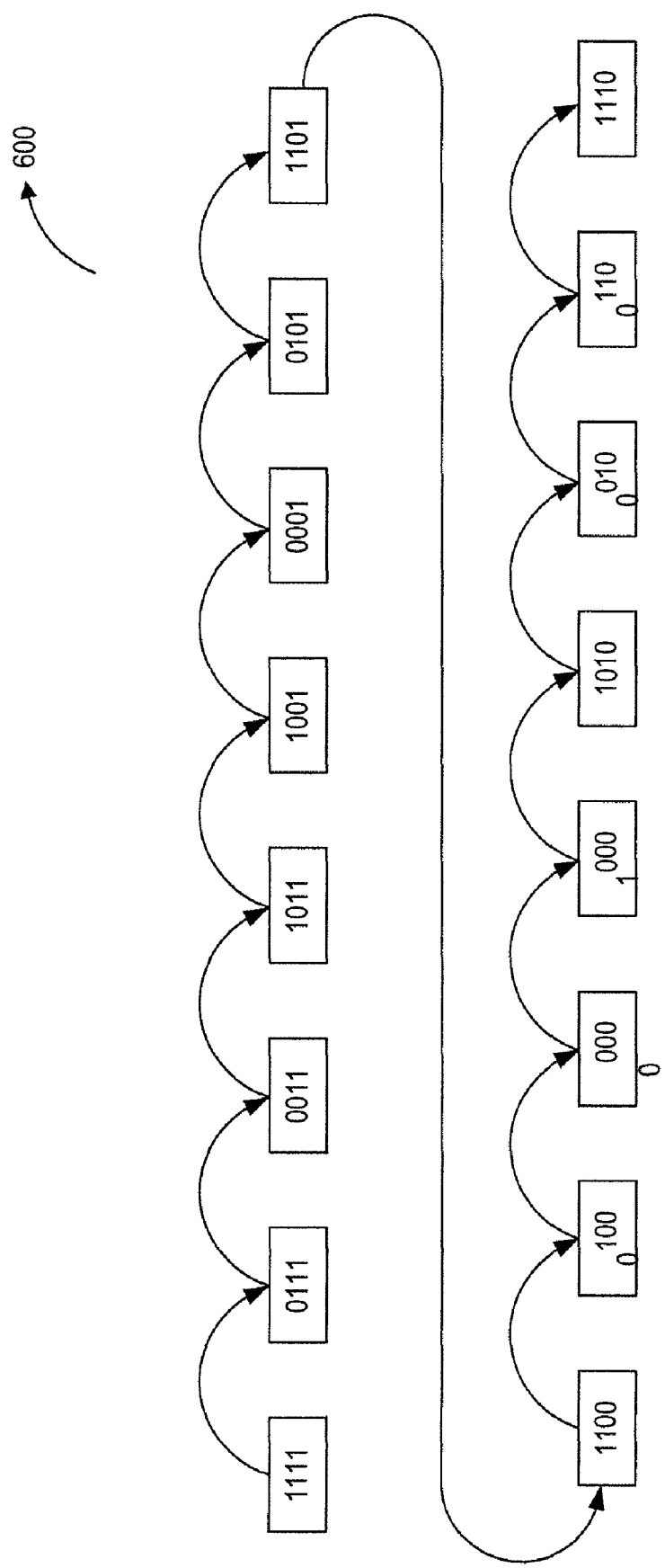
FIG. 6 is a flow diagram illustrating a sequence of asymmetric error correction, consistent with one embodiment of the presently-claimed invention.

For example, FIG. 6 illustrates a sequence 600 of asymmetric error correction when Gray mapping is used. The sequence may be listed from the lowest state to the highest state in the form of 1111, 0111, 0011, 1011, 1001, 0001, 0101, 1101, 1100, 0100, 0000, 1000, 1010, 0010, 0110, and 1110. The received cell data (group two) may be 1101 and may be indicated in error by the inner code decoder. By the assumption, the error is mostly due to a threshold voltage shift of the cell from its left adjacent state 0101 to 1101. The asymmetric error correction unit thus corrects the bits of the cell (group two) from 1101 to 0101.

Returning now to FIG. 5, in step 512, outer decoding and residual error correction may be performed on the groups of logical cells of data. Step 512 may be performed by, for example, outer decoder 308 in decoder 300 and the error correction may be referred to as symmetric error correction. Next, the corrected data may be multiplexed and outputted, and the method may end (step 514).

The foregoing description has been presented for purposes of illustration. It is not exhaustive and does not limit the invention to the precise forms or embodiments disclosed. Modifications and adaptations of the invention can be made from consideration of the specification and practice of the disclosed embodiments of the invention. For example, one or more steps of methods described above may be performed in a different order or concurrently and still achieve desirable results.

Other embodiments of the invention will be apparent to those skilled in the art from consideration of the specification and practice of the invention disclosed herein. It is intended that the specification and examples be considered as exemplary only, with a true scope of the invention being indicated by the following claims.

What is claimed is:

1. An apparatus for encoding data, the apparatus comprising:
    an outer encoder configured to generate a code word corresponding to received input data;
    a de-multiplexer configured to divide the code word into sub-sectors of data, wherein the sub-sectors of data are divided based upon memory capacities of memory cells into which the received input data is to be written;
    a parity circuit configured to
        divide the sub-sectors of data into groups of logical cells of data, wherein each group of logical cells of data includes a first logical cell, and
        compute parities of the groups of logical cells of data; and
    an inner encoder configured to
        generate error correction bits for at least some of the first logical cells based on parities of the groups of logical cells of data, and
        insert the error correction bits into at least some of the first logical cells to create encoded data.

2. The apparatus of claim 1, further comprising a gray code mapping circuit configured to map the encoded data to signal levels corresponding to the memory cells.

3. The apparatus of claim 2, further comprising a multiplexer configured to (i) multiplex the encoded data and (ii) output the encoded data, wherein the multiplexer uses the signal levels to write the encoded data into the corresponding memory cells.

4. The apparatus of claim 1, wherein the inner encoder encodes the groups of logical cells of data with the parities computed from the logical cells of data.

5. The apparatus of claim 1, wherein:
    the outer encoder generates the code word by encoding the received input data into encoded symbols; and
    each encoded symbol in the code word contains an integer number of logical cells of data.

6. A method for encoding data by using an encoder, the method comprising:
    generating a code word corresponding to received input data;
    based upon memory capacities of memory cells into which the received input data is to be written, dividing the code word into sub-sectors of data;
    dividing the sub-sectors of data into logical cells of data, wherein each group of logical cells includes a first logical cell;
    computing parities of the groups of logical cells of data;
    based on parities of the groups of logical cells of data, generating an error correction bit for at least some of the first logical cells; and
    inserting the error correction bit into the at least some of the first logical cells.

7. The method of claim 6, further comprising:
    multiplexing the logical cells of data with the error correction bits; and
    outputting the logical cells of data with the error correction bit.

8. The method of claim 7, further comprising:
    determining a correspondence between (i) memory cells and (ii) the logical cells of data that are output;
    mapping the logical cells of data that are output to signal levels of the corresponding memory cells;
    based on the signal levels, writing the logical cells of data into the corresponding memory cells.

9. The method of claim 6, further comprising generating the first logical cells by allocating space in the groups of logical cells of data for insertion of the error correction bit.

10. The method of claim 6, further comprising encoding the logical cells of data with the parities computed from the logical cells of data.

11. The method of claim 6, further comprising:
    generating the code word by encoding the received input data; and
    including an encoded symbol in the code word, wherein the encoded symbol contains an integer number corresponding to the first logical cell.

* * * * *